US 6,198,224 B1

(12) United States Patent
Spitzl et al.

(10) Patent No.: US 6,198,224 B1
(45) Date of Patent: Mar. 6, 2001

(54) MICROWAVE PLASMA GENERATOR WITH THE SHORT CROSS-SECTIONAL SIDE OF THE RESONATOR PARALLEL TO THE CHAMBER AXIS

(75) Inventors: Ralf Spitzl, Niederscheuren 27a, D-53639 Konigswinter (DE); Benedikt Aschermann, Wuppertal; Marko Walter, Ober-Ramstadt, both of (DE)

(73) Assignee: Ralf Spitzl, Konigswinter (DE)

( * ) Notice: Subject to any disclaimer, the term of this patent is extended or adjusted under 35 U.S.C. 154(b) by 0 days.

(21) Appl. No.: 09/101,314
(22) PCT Filed: Dec. 23, 1996
(86) PCT No.: PCT/EP96/05821
  § 371 Date: Feb. 1, 1999
  § 102(e) Date: Feb. 1, 1999
(87) PCT Pub. No.: WO97/25837
  PCT Pub. Date: Jul. 17, 1997

(30) Foreign Application Priority Data
  Jan. 5, 1996 (DE) .............................. 196 00 223
(51) Int. Cl.$^7$ ...................................... H05H 1/46
(52) U.S. Cl. ............... 315/111.21; 315/111.41; 118/723 MW
(58) Field of Search .................. 315/111.21, 111.41; 118/723 MW, 723 ME, 723 MR, 723 MA, 723 AN; 156/345

(56) References Cited

U.S. PATENT DOCUMENTS 5,149,375 * 9/1992 Matsuyama ............... 118/723 AN X
5,517,085 * 5/1996 Engemann et al. ............. 315/111.21

FOREIGN PATENT DOCUMENTS 4235914  10/1992  (DE) .
0593931   9/1993  (EP) .
2668676  10/1990  (FR) .

* cited by examiner

Primary Examiner—Justin P. Bettendorf
(74) Attorney, Agent, or Firm—D. Peter Hochberg; Katherine R. Vieyra; William H. Holt

(57) ABSTRACT

A device for the production of microwave plasmas with a microwave generator 1 and its coupling system to a waveguide resonator 5 which encloses a plasma chamber 7 is proposed, the short side of the cross-section of the resonator 5 lying parallel, facing the z axis, in the common wall with the chamber 7, and the microwave power being coupled from the resonator 5 into the chamber 7 via coupling points 6 in this short cross-sectional side. The coupling points are preferably formed as azimuthal slot couplers in the common wall of 5 and 7. The reference numbers relate to FIG. 1.

6 Claims, 3 Drawing Sheets

MICROWAVE PLASMA GENERATOR WITH THE SHORT CROSS-SECTIONAL SIDE OF THE RESONATOR PARALLEL TO THE CHAMBER AXIS

CROSS-REFERENCE TO RELATED APPLICATIONS

This application claims priority to International Patent Application PCT/EP96/05821, filed Dec. 23, 1996 and to DE 196 00 223.0, filed Jan. 5, 1996.

BACKGROUND OF THE INVENTION

Various types of plasmas are produced using a wide variety of methods and are used, for example, for the modification of substrates. Plasma treatment is used, for example, for coating, cleaning and etching substrates, in medicine for the treatment of implants and in technology for purifying waste gases. The geometry of the workpieces to be treated ranges from flat substrates, fibre bundles or materials in web form, to any configuration of shaped articles. High efficiency and ready availability of microwave generators have given microwave plasmas considerable importance.

A variety of types of plasma treatment apparatus are known. In them, microwaves are injected into a plasma chamber via a feed and, optionally, a coupler. Different plasmas are used for various applications. Amongst other things, waveguides and coaxial cables are used for feeding the microwaves, and amongst other things antennas and slots are used for the coupling (DE 4235914).

A wide variety of different types of devices are used for the production of microwave plasmas. According to the prior art, the devices contain a plasma chamber, a container or working space contained therein, and a feeding waveguide which can be coupled thereto, often designed in the form of a surrounding waveguide resonator. It is expedient for these to be arranged on a common axis of rotation. Through input coupling, the microwaves emerge from the resonator into the plasma chamber (FR-A2 26 68 676, EP-A1 0 593 931). However, it has been shown that the known type of input coupling, for example through slots parallel to the axis of rotation and the design of the resonator, is not advantageous. A disadvantageous effect in this case is that, depending on the arrangement of the coupling points, it is not possible to excite particular field patterns, for example TM01n modes. This rules out important applications. There is therefore a need to provide a device for the uniform excitation of as many modes as possible and/or for the production of a large-scale particularly uniform plasma, the device operating in a wide pressure range of from $10^{-5}$ mbar to, in particular, more than 1 bar.

BRIEF SUMMARY OF THE INVENTION

The invention is therefore based on a device for the production of microwave plasmas, with a microwave generator 1, coupling 9 of the microwave generator to the resonator, a plasma chamber 1 with a container 8 contained therein, and at least one waveguide resonator 5 enclosing this chamber.

BRIEF DESCRIPTION OF THE DRAWINGS

The invention will be explained by illustrative embodiments in the drawings.

DETAILED DESCRIPTION OF THE INVENTION

Figure 1:
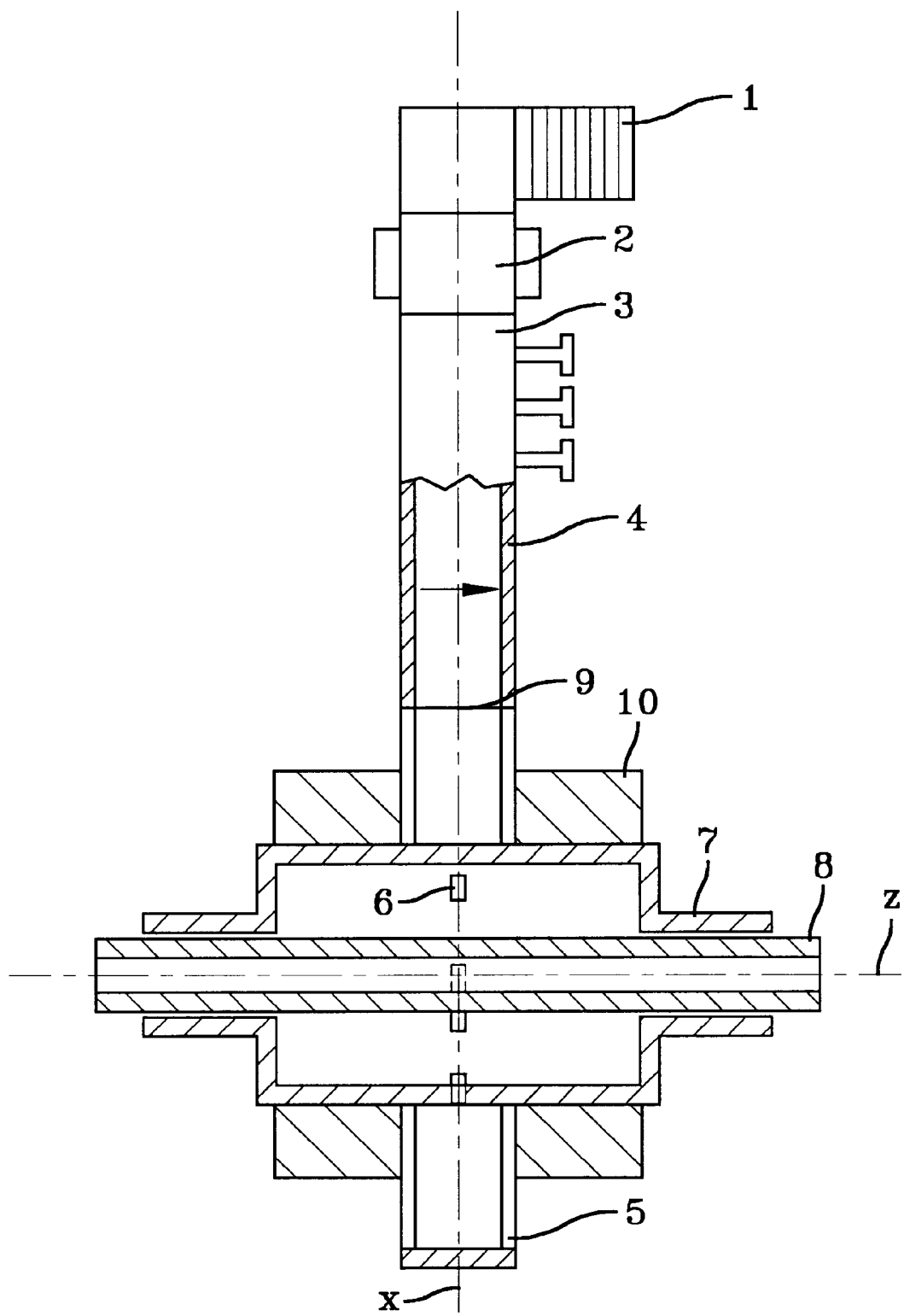
FIG. 1 shows a device according to the invention in section, with the x and z axes lying therein.

The invention relates to a device for the production of microwave plasmas of the said type, in which, according to the invention, the short cross-sectional side of the resonator 5 lies parallel to the axis of the device, or parallel to the axis of the plasma chamber 7, and the microwave power is coupled from the waveguide resonator 5 into the plasma chamber 7. The resonator 5 encloses the chamber 7 and has a common wall with the chamber, the resonator partially or fully enclosing the preferably cylindrical chamber, preferably in the form of a ring. It is also possible to design the resonator 5 in the form of a waveguide with matched termination.

A symmetrical arrangement of 5, 7 and 8 about a common axis z is expedient, the design not necessarily neeiing to involve rotational symmetry. If necessary, it is possible to depart from the symmetrical simplest design. The resonator is preferably a ring resonator, and may have an oval or approximately rectangular shape, or a circular shape. What is essential is an elongate design of the cross-section of 5, and the design of the wall common with the chamber 7 as the narrowest cross-sectional side of the resonator 5. It is very preferable for the resonator 5 to form a ring of rectangular cross-section with the narrow, short rectangle side facing the chamber 7 and being designed as a common wall with the latter.

However, it is also possible to design the resonator 5 as a waveguide which encloses the chamber wall with, for example, an essentially circular cross-section.

It is possible to have a plurality of resonators 5 with common or separate microwave generators, such resonators making it possible to have chambers 7 with large dimensions. The coupling points are preferably slots, and very preferably narrow slots, although it is also possible for antennas, loops or junctions to form the coupling points. If the coupling points are formed in the narrow or narrowest side, then the coupling may lie at arbitrary points on the common wall of the resonator 5 and chamber 7, about the z axis or parallel thereto. According to the invention, simplified input coupling with increased energy density takes place in the plasma chamber. This allows improved coating of large work pieces, and increased capacity in the case of chemical reactions, for example for the purification of waste gases.

It is expedient and preferable to have a rectangular cross-section, or optionally even a circular cross-section, for the resonator 5. It is also preferable for the design of the waveguide resonator 5 to be toroidal or essentially annular.

In accordance with the present invention, it is very preferable for the coupling points 6 to be formed as azimuthally oriented slot couplers, that is to say perpendicular to the z axis. As a result, in the direction of their long side, the slots lie exactly or approximately on a circle around the z axis, perpendicular thereto. It is also possible for the slots to lie on parallel circles, or at an angle of, for example, 45° thereto.

According to the invention, in the case when the ring resonator 5 has a rectangular cross-section, the short cross-sectional side is perpendicular to the radial direction of this resonator and parallel to the axis of rotation of the plasma chamber 7. Coupling the microwaves via the short rectangle side of 5 has the result that when coupling slots are used in the wall between 5 and 7, they need not extend parallel to the axis of rotation z of the plasma chamber. In the case when azimuthal slots are used in the wall between 5 and 7, the ring resonator has parallel admittances.

In the resonator 5, the coupling points 6 preferably lie at the points of the electric field maxima of the standing wave. Although the length and separation of the coupling points ought to be uniform, there is an advantage in that exact uniformity is not required.

It is preferable for the coupling points to lie at the points of the in-phase E field maxima of the standing wave.

The length of a coupling point, preferably of the slots, may correspond to the full length of an E field half-wave.

Coupling may take place using a circulator, tuning unit, feed and input microwave coupler, preferably H junctions and E junctions, loops, antennas or the like. The microwave coupling from 1 to 5 may be tuned, for example, by three-pin tuners, a magic T piece, termination discs or other tuning elements, even on the opposite side of the input microwave coupling from 5.

The plasma chamber 7, and accordingly the waveguide resonator 5 around it, is designed for example as a ring resonator for the excitation of particular modes, and may accordingly be designed in the form of a cylinder, in particular with circular cross-section, or alternatively in the form of a cube, a square or rectangular column or the like, even with an irregular shape. The toroidal rectangular waveguide resonators 5 may also be fed by a plurality of microwave generators.

The chamber 7 may be designed with the diameter and height needed for the excitation of a TM010 mode, or with dimensions for the excitation of TM01n, (n=1,2,3, . . . ) modes. On account, for example, of the dielectric properties of the container 8, the field distribution may differ from the ideal TM01n (n=0,1,2, . . . ) field distribution of the unperturbed resonator 5.

Through additional electric coils or permanent magnets 10, it is possible to produce a magnetic field in the chamber 7, by means of which it is possible to achieve electron cyclotron resonance for the generation of high ion densities at low container pressures, of about $<10^{-2}$ hPa.

Depending on the design of the container 8, for example made of quartz glass, which is used in the plasma chamber, it is possible, on the one hand, for the near field of the input coupling points, for example in the form of slot antennas or rod antennas, or when the plasma chamber is correspondingly dimensioned, a resonator mode desired for the application case, for example TM01n with n=0,1,2 . . . in the case of cylinder resonators, to be employed for the plasma production. In the case of the TM010 mode of the cylinder resonator, an extended plasma along the z axis is produced. In the case of TM01n with n>0, the diameters may be selected as a function of the length of the resonator, and large plasma volumes can be achieved.

The microwave generator has, for example, a magnetron vacuum tube of frequency: 2.45 GHz.

In the case of exciting microwave modes in the plasma chamber, for example the cylinder modes TM01n with n=0,1,2 . . . , the slots should be chosen in such a way that they are arranged in front of the in-phase maxima of the ring resonator mode. However, in the case when the near field of the slot couplers is used for producing the plasma, it is also possible to arrange the slots at every maximum. The length of the coupling slots should not exceed the in-phase regions, and for maximum input power coupling the length should exactly cover the half-waves.

It is also possible for the device to contain several of all the components.

In FIG. 1, an annular waveguide resonator 5 has the short side of its rectangular cross-section in the cylinder wall of the plasma chamber 7, and is supplied with microwaves from a microwave generator 1 via a coupling system 2, 3, 4, 9 consisting of a circulator 2, tuning unit 3, for example 3-pin tuner, feed 4 and input microwave coupling point 9, for example in the form of a H junction or E junction. The arrow in the drawing indicates the direction of the E field, and x and z denote the axes. On the short side of the rectangular cross-section of the ring resonator 5, the coupling slots 6 indicated in the projection pass through the wall of this resonator common with the plasma chamber 7. In this case, magnet coils 10 lead to electron cyclotron resonance excitation.

Figure 2:
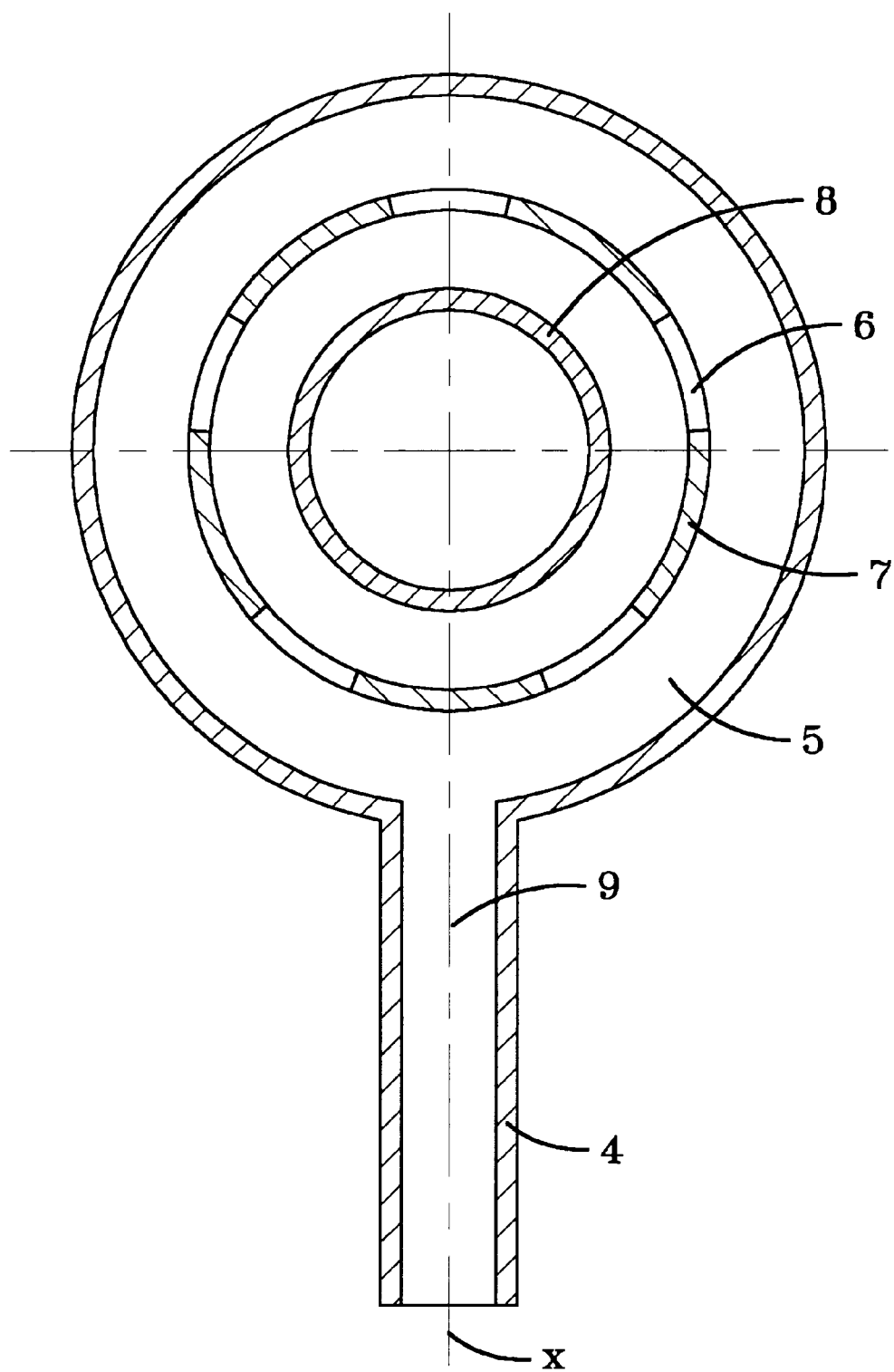
FIG. 2 shows a plan view of this device in the direction of the z axis.

In FIG. 2, in accordance with the slots 6 shown in FIG. 1 in the annular wall of the resonator 5, the microwaves couple into the chamber 7 with container 8. In the ring resonator 5, the E field vectors are perpendicular to the plane of the drawing.

Figure 3:
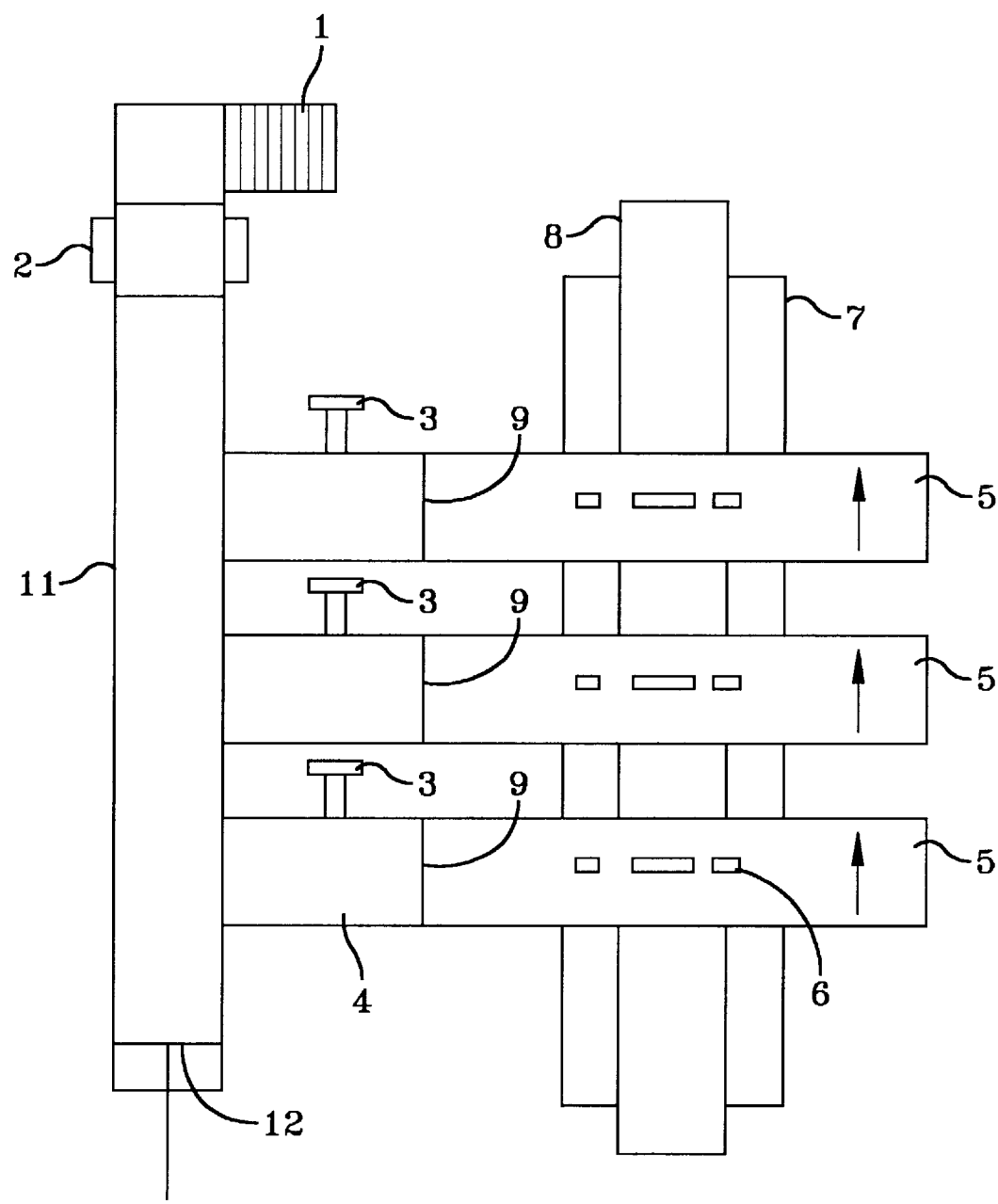
FIG. 3 shows the section of a device according to the invention, with the coupling of three resonators 5 to a common microwave generator 1 and a common plasma chamber 7.

In FIG. 3, via the feed through the delivery resonator 11, there is triple, preferably in-phase coupling of toroidal rectangular waveguide resonators 5 to a plasma chamber 7. A short-circuit disc 12 is used for tuning the delivery resonator. Resonators 5 are tuned using the pin tuners 3. The arrows indicate the orientation of the E field in the ring resonator, which according to the invention is parallel to the z axis and perpendicular to the microwave coupling slots.

What is claimed is:

1. A device for the production of microwave plasmas comprising a plasma chamber (7) and a resonator (5), wherein the resonator (5) has a short cross-sectional side arranged parallel to an axis of the device, or parallel to an axis of the plasma chamber (7), and microwave power is coupled from the resonator (5) into the chamber (7) via coupling points (6) in the short cross-sectional side of the resonator (5).

2. A device according to claim 1, further comprising a common wall between the resonator and the plasma chamber, wherein the coupling points (6) are formed as azimuthally oriented slot couplers in the common wall between the resonator (5) and the plasma chamber (7).

3. A device according to claim 1, further comprising a common wall between the resonator and the plasma chamber, wherein the coupling points (6) are formed as antennas or loops in the common wall of the resonator (5) and the plasma chamber (7).

4. A device according to one of claims 1 to 3, wherein the plasma chamber (7) comprises a microwave resonator in the form of a cube, a cuboid, a square or a rectangular column, or a cylinder.

5. A device according to one of claims 1 to 3, additionally comprising electrical coils or permanent magnets (10) producing a magnetic field in the chamber (7).

6. A device according to one of claims 1 to 3, wherein the resonator (5) encloses the plasma chamber (7).

* * * * *